United States Patent [19]

Okamura

[11] Patent Number: 5,473,568
[45] Date of Patent: Dec. 5, 1995

[54] READ WRITE MEMORY WITH NEGATIVE FEEDBACK-CONTROLLED DUMMY MEMORY CIRCUIT

[75] Inventor: Hitoshi Okamura, Tokyo, Japan

[73] Assignee: NEC Corporation, Japan

[21] Appl. No.: 287,243

[22] Filed: Aug. 8, 1994

[30] Foreign Application Priority Data

Aug. 9, 1993 [JP] Japan .................................. 5-197174

[51] Int. Cl.⁶ .................................................. G11C 7/02
[52] U.S. Cl. .................... 365/210; 365/207; 365/189.07; 365/156
[58] Field of Search .................................... 365/156, 190, 365/210, 189.07, 207

[56] References Cited

U.S. PATENT DOCUMENTS

| | | | |
|---|---|---|---|
| 4,223,394 | 9/1980 | Pathak et al. | 365/210 |
| 4,792,928 | 12/1988 | Tobita | 365/210 |
| 4,802,138 | 1/1989 | Shimamune | 365/210 |

Primary Examiner—Joseph A. Popek
Attorney, Agent, or Firm—Ostrolenk, Faber, Gerb & Soffen

[57] ABSTRACT

A static random access memory comprises word lines for receiving a cell selection signal, and arrays of first memory cells connected to the word lines. First load circuits are respectively connected to the arrays of the first memory cells for supplying a voltage from a voltage source to the arrays. First amplifier circuits are connected respectively to the first memory cells. A second, or dummy memory cell identical to each of the first memory cells is provided for storing a predetermined binary digit. A second load circuit identical to each of the first load circuits supplies the voltage from the voltage source to the dummy memory cell. A second amplifier circuit identical to each of the first amplifier circuits is connected to the dummy memory cell. A comparator circuit generates an output representative of the deviation of a voltage developed by the second amplifier circuit from a reference voltage and negatively feeds it back to each of the first load circuits and to the second load circuit so that a voltage developed by each of the first memory cells is controlled to a level determined by the reference voltage.

7 Claims, 2 Drawing Sheets

READ WRITE MEMORY WITH NEGATIVE FEEDBACK-CONTROLLED DUMMY MEMORY CIRCUIT

BACKGROUND OF THE INVENTION

1. Field of the Invention

The present invention relates generally to integrated circuits semiconductor memories, and more specifically to a read write memory in which a load circuit is provided for each array of memory cells as a load of the transistors of each memory cell.

2. Description of the Related Art

In a prior art static random access memory where each memory cell is supplied with a voltage through a bit line from a circuit that serves as a load of the driving transistors of the cell through a gate-controlled coupling transistor, a voltage developed at the bit line is determined by the ratio of the ON-resistance value of the loading transistor to the combined ON-resistance values of the coupling transistor and one of the driving transistors of the cell. Since the operating characteristics of these transistors vary with device variabilities due to manufacture and temperature variations, the memory is designed with a safety margin to accommodate such factors, and hence, the operating performance of the memory cannot be exploited to the fullest extent.

SUMMARY OF THE INVENTION

It is therefore an object of the present invention to provide a static random access memory capable of automatically compensating for device variabilities and temperature variations to achieve high speed operation.

According to a broader aspect, the present invention provides a memory which comprises a plurality of word lines for receiving a cell selection signal, a first load circuit connected to a voltage source, an array of first memory cells, each including a pair of coupling transistors and a pair of inverters connected in anti-parallel relationship to each other between the coupling transistors for allowing the inverters to assume one of two binary states. The coupling transistors are connected to one of the word lines for establishing a path between the first load circuit and the inverters in response to the cell selection signal to receive a voltage from the first load circuit. A first amplifier circuit is connected to the array of first memory cells. A second memory cell identical to each of the first memory cells is provided for assuming a predetermined binary state. A second load circuit identical to the first load circuit is connected to the voltage source for supplying the voltage to the second memory cell. A second amplifier circuit identical to the first amplifier circuit is connected to the second memory cell. A comparator circuit is provided for generating an output voltage representative of the deviation of a voltage developed by the second amplifier circuit from a reference voltage and negatively feeding the output voltage back to the first and second load circuits so that a voltage developed by each of the first memory cells is controlled to a level determined by the reference voltage.

According to a second aspect, the present invention provides a static random access memory which comprises a plurality of word lines for receiving a cell selection signal, and a plurality of arrays of first memory cells connected to the word lines. A plurality of first load circuits are respectively connected to the arrays of the first memory cells for supplying a voltage thereto. A plurality of first amplifier circuits are connected respectively to the arrays of the first memory cells. A second, dummy memory cell identical to each of the first memory cells is provided for storing a predetermined binary digit. A second load circuit identical to each of the first load circuits supplies the voltage from the voltage source to the second memory cell. A second amplifier circuit identical to each of the first amplifier circuits is connected to the second memory cell. A comparator circuit generates an output voltage which represents the deviation of a voltage developed by the second amplifier circuit from a reference voltage and negatively feeding the output voltage back to each of the first load circuits and the second load circuit so that a voltage developed by each of the first memory cells is controlled to a level determined by the reference voltage.

BRIEF DESCRIPTION OF THE DRAWINGS

The present invention will be described in further detail with reference to the accompanying drawings, in which.

DETAILED DESCRIPTION

Figure 1:
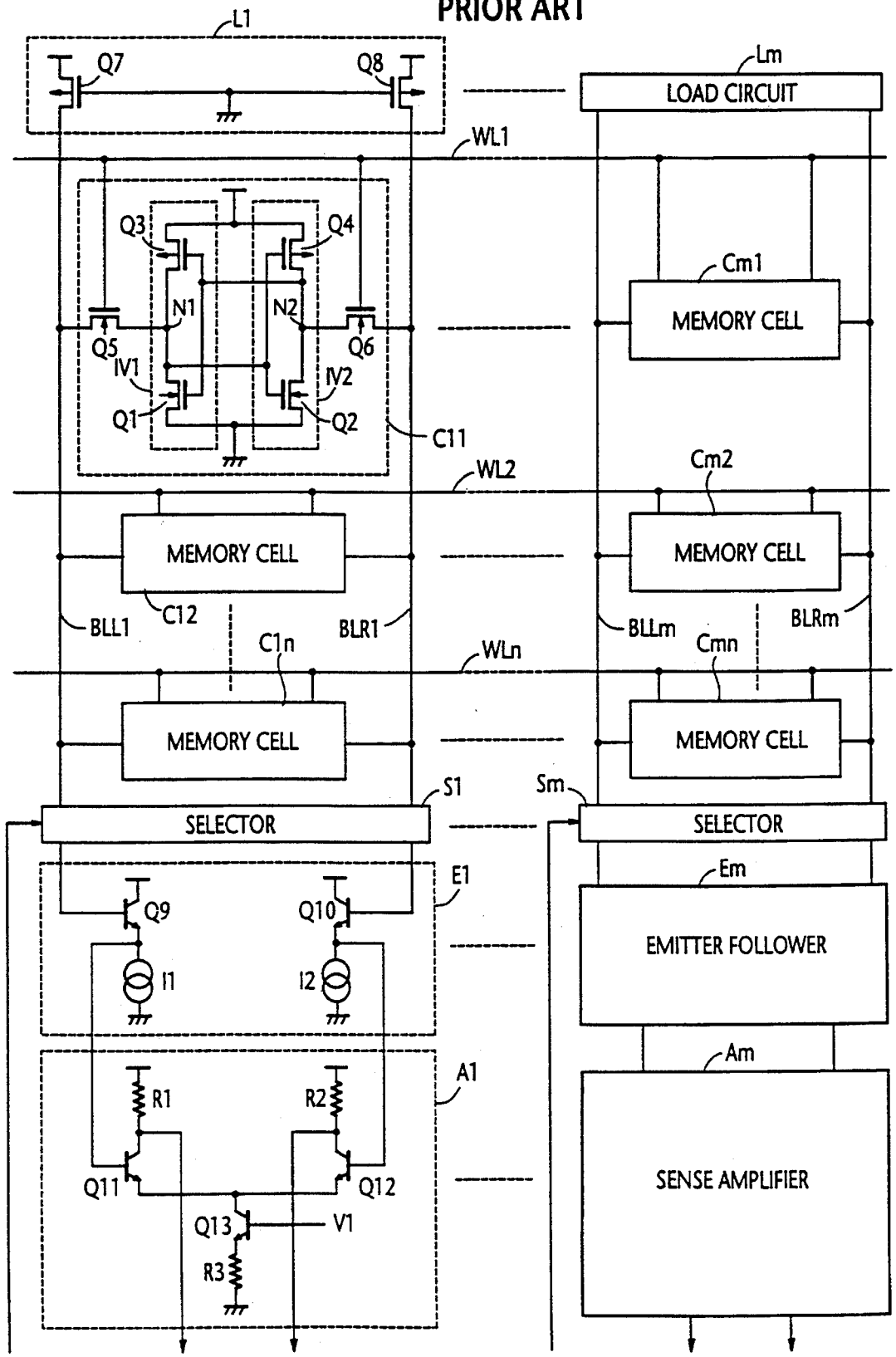
FIG. 1 is a circuit diagram of a prior art static random access memory.

Before going into the detail of the present invention, reference is first made to FIG. 1 wherein a prior art static random access memory is illustrated. The memory includes a plurality of memory cells C11 through Cmn arranged row by row between word lines WL1~WLn and column by column between bit lines BLLi and BLRi (where i=1, 2, ... m). Load circuits L1 to Lm are connected respectively to pairs of bit lines BLL1, BLR1 to BLLm, BLRm.

Each memory cell Cij (j=1, 2, ... n) includes a pair of inverters IV1 and IV2 connected in an anti-parallel relationship to each other between coupling transistors Q5 and Q6. Inverter IV1 is formed with an N-channel field effect driving transistor Q1 and a P-channel field effect driving transistor Q3 whose drain terminals are connected together to a node N1 and whose source terminals are connected to ground and a voltage source, respectively. Likewise, inverter IV2 is formed with an N-channel field effect driving transistor Q2 and a P-channel field effect driving transistor Q4 whose drain terminals are connected together to a node N2 and whose source terminals are connected to ground and the voltage source, respectively. The gate terminals of the transistors Q1, Q3 are connected together to the node N2 where the output of the inverter IV2 appears, and the gate terminals of the transistors Q2, Q4 are connected together to the node N1 where the output of the inverter IV1 appears. The drain-source path of the coupling transistor Q5 is connected between bit line BLLi and node N1 and the drain-source path of the coupling transistor Q6 is connected between bit line BLRi and node N2. The gate terminals of transistors Q5 and Q6 of each memory cell Cij are connected to word line WLi. The ON-OFF operation of each of the transistors Q1 and Q4 is complementary to those of transistors Q2 and Q3.

Load circuit Li includes a pair of P-channel field effect transistors Q7 and Q8 whose gate terminals are connected together to ground. The bit lines BLLi and BLRi are connected through the transistors Q7 and Q8, respectively, to the voltage supply. The transistors of each load circuit Li serve as a load of the driving transistors Q1 and Q2 of each memory cell Cij.

The low voltage level of bit line BLLi is determined by the ratio of the ON-resistance value of transistor Q7 to the ON-resistance values of transistors Q5 and Q1 combined, and likewise, the low voltage level of bit line BLRi is determined by the ratio of the ON-resistance value of transistor Q8 to the ON-resistance values of transistors Q6 and Q2 combined. If nodes N1 and N2 of a memory cell Cij are at high and low voltage levels, respectively (i.e., Q1 is OFF and Q2 is ON), the application of a high voltage to word line WLi causes transistors Q5 and Q6 to be turned ON. The turn-on of transistor Q5 causes a low-impedance path to be established from the voltage supply through transistors Q7, Q5 and Q1 to ground so that bit line BLLi is driven to a low voltage level which is determined by the ratio of the ON-resistance value of Q7 to the combined ON-resistance values of Q5 and Q1. As a result, transistor Q2 is turned off, switching bit line BLRi from low to high voltage level. A reversal of voltage (50 mV to several hundreds of mV) occurs between the bit lines to signify a binary 0 or 1 depending on the previous state.

Selectors Si are connected respectively to bit lines BLLi and BLRi for coupling the associated bit lines to an emitter follower buffer amplifier Ei in response to a select signal applied thereto. A sense amplifier Ai is connected to the outputs of selector Si for amplifying the voltages from buffer amplifier Ei for delivery to external circuitry. The emitter follower Ei is formed with a first series circuit of an NPN transistor Q9 and a constant current source I1 and a second series circuit of an NPN transistor Q10 and a constant current source I2, with both of the series circuits being connected between the voltage supply and ground. Bit lines BLLi and BLRi are connected to the base terminals of Q9 and Q10, respectively, to produce output voltages at the emitter terminals of transistors Q9 and Q10. The emitter terminals of transistors Q9 and Q10 are connected respectively to the base terminals of NPN transistors Q11 and Q12 which form part of the sense amplifier 3. The collector terminals of Q11 and Q12 are connected through resistors R1 and R2 to the voltage supply and their emitter terminals are connected together to the collector terminal of an NPN transistor Q13 whose emitter is connected by a resistor R3 to ground. The base terminal of transistor Q13 is biased by a reference voltage V1.

The time taken to produce a voltage reversal across the bit lines accounts for as large as several tens of percentage of the total access time. To reduce the access time, it is desirable that the voltage across the bit lines be as small as possible. Since the ratio of the ON-resistance value of transistor Q7 (Q8) to the combined ON-resistance values of transistors Q5, Q1 (Q6, Q2) determines the voltage across the bit lines, the voltage may fluctuate with the inherent variabilities of these transistors due to manufacture and ambient temperature variations. The integrated circuits memory is designed with these factors in mind to ensure against the worst condition that can occur.

Figure 2:
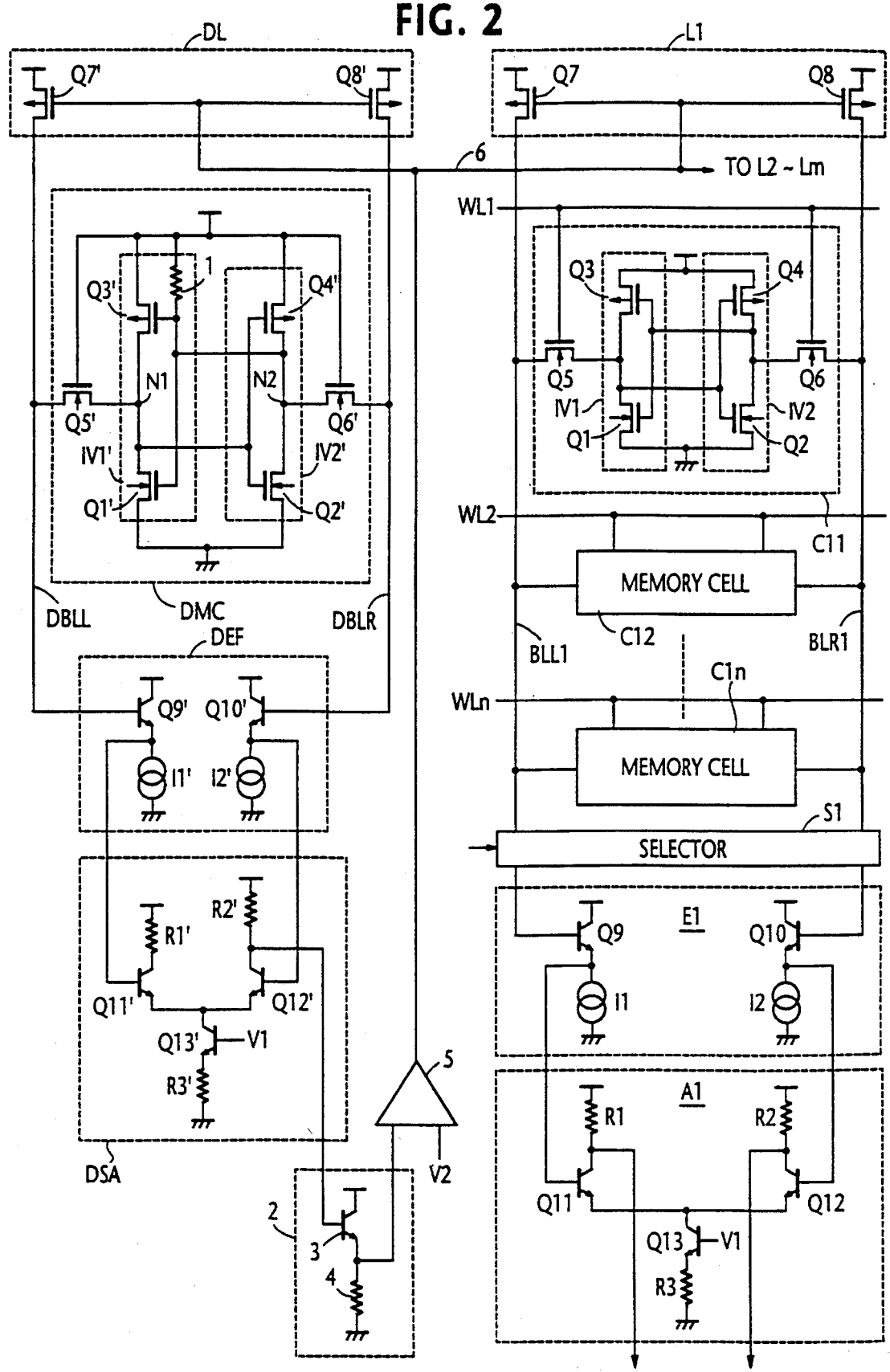
FIG. 2 is a circuit diagram of a static random access memory of the present invention.

A static random access memory according to the present invention is shown in FIG. 2. The memory includes a plurality of dummy circuits. These are a dummy load circuit DL, a dummy memory cell DMC connected between dummy bit lines DBLL and DBLR, a dummy emitter follower DEF, and a dummy sense amplifier DSA. Dummy load circuit DL is formed with transistors Q7' and Q8' having identical operating characteristics to those of transistors Q7 and Q8 of each load circuit Li. Dummy memory cell DMC comprises a pair of anti-parallel connected inverters IV1' and IV2' formed with of transistors Q1' to Q4' which are of identical operating characteristics to, and connected in an identical configuration to, those of the transistors Q1 to Q4 of each memory cell Cij and a pair of coupling transistors Q5' and Q6' identical in operating characteristics to those of transistors Q5 and Q6. Inverter IV1' differs from inverter IV1 in that a resistor 1 is connected between the gate terminal of transistor Q3' and the voltage source and the gate terminals of transistors Q5', Q6' are connected to the voltage source. The provision of the resistor 1 is to hold the dummy memory cell DMC at a predetermined binary level.

As a result, transistor Q1' is turned on, while Q2' is turned off, so that nodes N1 and N2 are permanently held at low and high voltage levels, respectively, and transistors Q5' and Q6' are permanently in the ON state, so that the dummy bit line DBLL is permanently held at a low voltage determined by the ratio of the ON-resistance value of transistor Q7' to the combined ON-resistance values of transistors Q5' and Q1', and the dummy bit line DBLR is permanently held at the high voltage level of the voltage supply.

Dummy emitter follower DEF is likewise formed with transistors Q9', Q10' and constant current sources I1' and I2' which are identical both in operating characteristics and in circuit configuration to those of each emitter follower Ei, with the exception that the base terminals of transistors Q9' and Q10' are connected direct to the dummy bit lines DBLL and DBLR, respectively. Similarly, the dummy sense amplifier DSA is comprised by transistors Q11', Q12', Q13' and resistors R1', R2' which are identical both in operating characteristics and in circuit configuration to those of each of sense amplifiers A1 to Am. Dummy sense amplifier DSA provides amplification of the difference in voltage between the dummy bit lines. The base terminal of transistor Q13' is biased by the same reference voltage V1 as applied to the gate terminal of transistor Q13.

An emitter follower buffer amplifier 2 is provided for buffering the output of the dummy sense amplifier DSA. Buffer amplifier 2 comprises a series of NPN transistor 3 and a resistor 4 connected between the voltage supply and ground, with the base terminal of transistor 3 being connected to the collector of transistor Q12' of dummy sense amplifier DSA to produce the amplified bit-line difference voltage across the resistor 4. This voltage is supplied to a differential amplifier 5 and compared with a reference voltage V2 to produce a voltage output representative of the deviation of the dummy bit line potential from the reference voltage V2.

The output of differential amplifier 5 is supplied to the gate terminals of transistors Q7' and Q8' of dummy load circuit DL and to the gate terminals of transistors Q7 and Q8 of all load circuits L1 to Lm through line 6. A negative feedback loop is therefore formed through the dummy circuits described above, and the deviation of the voltage difference between the dummy bit lines from the reference voltage V2 is negatively fed back to the gate terminals of transistors Q7' and Q8', so that the voltage difference between the dummy bit lines is controlled to a value determined by the reference voltage V2 regardless of the manufacturing variabilities and temperature variations. Since the memory cells and other circuits of the static random access memory are constructed with circuit elements of the identical operating characteristics to those of corresponding circuit elements of the dummy circuitry, the negative feedback operation of the dummy circuitry causes the voltage difference between the bit lines BLLi and BLRi to be controlled to the value determined by the reference voltage V2.

Since the reference voltage V2 determines the voltage difference between the bit lines BLLi and BLRi, the access time of the memory can be reduced by setting the reference voltage V2 so that the voltage difference is maintained at a small value. If the voltage difference is maintained at 30 millivolts that is smaller than the dynamic range (100 millivolts) of the sense amplifiers Si, DSA and if the gain of these sense amplifier is 10 dB and the offset error of the differential amplifier 5 is 10 millivolts, then the fluctuation of the voltage difference can be held to 1 millivolt or less.

While mention has been made of an embodiment in which two bit lines are employed, the present invention could equally be as well used for a static random access memory of single bit line structure by using X and Y word lines for each memory cell instead of a single word line.

What is claimed is:

1. A memory comprising:
    a plurality of word lines for receiving a cell selection signal;
    a pair of bit lines;
    a first load circuit connected to the bit lines for applying thereto a voltage source;
    an array of first memory cells, each including a pair of coupling transistors having a control terminal connected to a word line and a current path connected between said bit lines, and a pair of inverters connected in anti-parallel relationship to each other between said coupling transistors, said coupling transistors establishing a path between said bit lines and said inverters in response to said cell selection signal to cause said inverters to assume one of two binary states;
    first amplifier means connected to said array of first memory cells;
    a pair of dummy bit lines;
    a second dummy load circuit identical to the first load circuit and connected to the dummy bit lines for applying thereto said voltage source;
    a second dummy memory cell including a pair of coupling transistors having a control terminal connected to a bias source and a current path connected between said dummy bit lines, and a pair of inverters connected in anti-parallel relationship to each other between said coupling transistors, said coupling transistors defining a path between said dummy bit lines and said inverters to cause said inverters to assume a predetermined binary state;
    second amplifier means connected to said second memory cell; and
    comparator means for generating an output voltage representative of a deviation of a voltage developed by said second amplifier means from a reference voltage and negatively feeding the output voltage back to said first and second load circuits.

2. A memory as claimed in claim 1, wherein said first load circuit includes a first field effect transistor having a source-drain path connected between said voltage source and said first memory cells, and wherein said second load circuit includes a second field effect transistor identical in operating characteristic to the first field effect transistor, the second transistor having a source-drain path connected between said voltage source and said second memory cell, the first and second transistors having a gate terminal connected to the output of said comparator means.

3. A static random access memory comprising:
    a plurality of word lines for receiving a cell selection signal;
    a plurality of pairs of bit lines;
    a plurality of first load circuits connected to the bit lines of a respective one of the pairs of bit lines for applying a voltage source thereto;
    a plurality of arrays of first memory cells, said arrays corresponding respectively to said first load circuits, each of the first memory cells including a pair of coupling transistors having a control terminal connected to a word line and a current path connected between the bit lines of a respective one of said pairs, and a pair of inverters connected in anti-parallel relationship to each other between said coupling transistors, said coupling transistors of each of the arrays providing a path between the bit lines of said one pair and said inverters in response to said cell selection signal to cause said inverters to assume one of two binary states;
    a plurality of first amplifier means being connected respectively to said arrays of said first memory cells;
    a pair of dummy bit lines;
    a second dummy load circuit identical to each of the first load circuits and connected to the dummy bit lines for applying said voltage source thereto;
    a second dummy memory cell including a pair of coupling transistors having a control terminal connected to a bias source and a current path connected to the dummy bit line, and an inverter connected so said coupling transistor, said coupling transistor establishing a path between said dummy bit line and said inverter to cause the inverter to assume a predetermined binary state;
    second amplifier means connected to said second memory cell; and
    comparator means for generating an output voltage representative of a deviation of a voltage developed by said second amplifier means from a reference voltage and negatively feeding the output voltage back to each of said first load circuits and said second load circuit.

4. A static random access memory as claimed in claim 3, wherein each of said first load circuits includes a pair of first field effect transistors having source-drain paths connected between said voltage source and the bit lines of the respective pair, and wherein said second load circuit includes a pair of second field effect transistors identical in operating characteristic to the pair of the first field effect transistors, the second field effect transistors having source-drain paths connected between said voltage source and said dummy bit lines, each of the first and second field effect transistors having a gate terminal connected to the output of said comparator means.

5. A memory comprising:
    a plurality of word lines for receiving a cell selection signal;
    a bit line;
    a first load circuit connected to the bit line for applying thereto a source voltage;
    an array of first memory cells, each including a coupling transistor having a control terminal connected to a word line and a current path connected to said bit line, and an inverter connected to said coupling transistor, said coupling transistor providing a path to said bit line and said inverter in response to said cell selection signal to cause said inverter to assume one of two binary states;
    first amplifier means connected to said array of first memory cells;
    a dummy bit line;

a second dummy load circuit identical to the first load circuit and connected to the dummy bit line for applying said voltage source thereto;

a second dummy memory cell including a coupling transistor having a control terminal connected to a bias source and a current path connected to said dummy bit line, and an inverter connected to said coupling transistor, said coupling transistor establishing a path between said dummy bit line and said inverter to cause said inverter to assume a predetermined binary state;

second amplifier means connected to said second memory cell; and comparator means for generating an output voltage representative of a deviation of a voltage developed by said second amplifier means from a reference voltage and negatively feeding the output voltage back to said first and second load circuits.

6. A static random access memory as claimed in claim 5, wherein each of said first load circuits includes a first field effect transistor having a source drain path connected between said voltage source and the bit line, and wherein said second load circuit includes a second field effect transistor identical in operating characteristic to the first field effect transistor, the second field effect transistor having a source-drain path connected between said voltage source and said dummy bit line, each of the first and second field effect transistors having a gate terminal connected to the output of said comparator means.

7. A static random access memory comprising:

a plurality of word lines for receiving a cell selection signal;

a plurality of bit lines;

a plurality of first load circuits connected to one of the bit lines for applying a voltage source thereto;

a plurality of arrays of first memory cells, said arrays corresponding respectively to said first load circuits, each of the first memory cells including a transistor having a control terminal connected to a word line and a current path connected to one of the bit lines, and an inverter connected to said coupling transistor, said transistor of each of the arrays providing a path between one of the bit lines and said inverters in response to said cell selection signal to cause said inverters to assume one of two binary states;

a plurality of first amplifier means being connected to said arrays of said first memory cells;

a dummy bit line;

a second dummy load circuit identical to each of the first load circuits and connected to the dummy bit line for applying said voltage source thereto;

a second dummy memory cell including a coupling transistor having a control terminal connected to a bias source and a current path connected to the dummy bit line, and an inverter connected to said coupling transistor, said coupling transistor establishing a path between said dummy bit line and said inverter to cause the inverter to assume a predetermined binary state;

second amplifier means connected to said second memory cell; and comparator means for generating an output voltage representative of a deviation of a voltage developed by said second amplifier means from a reference voltage and negatively feeding the output voltage back to each of said first load circuits and said second load circuit.

* * * * *